United States Patent
Takahashi

(10) Patent No.: US 10,276,277 B2
(45) Date of Patent: Apr. 30, 2019

(54) RESIN COMPOSITION, COPPER PASTE, AND SEMICONDUCTOR DEVICE

(71) Applicant: NAMICS CORPORATION, Niigata (JP)

(72) Inventor: Tomoyuki Takahashi, Niigata (JP)

(73) Assignee: NAMICS CORPORATION, Niigata (JP)

(*) Notice: Subject to any disclaimer, the term of this patent is extended or adjusted under 35 U.S.C. 154(b) by 0 days.

(21) Appl. No.: 15/750,866

(22) PCT Filed: Jul. 27, 2016

(86) PCT No.: PCT/JP2016/071984
§ 371 (c)(1),
(2) Date: Feb. 7, 2018

(87) PCT Pub. No.: WO2017/029953
PCT Pub. Date: Feb. 23, 2017

(65) Prior Publication Data
US 2018/0233248 A1 Aug. 16, 2018

(30) Foreign Application Priority Data

Aug. 19, 2015 (JP) .................................. 2015-161608

(51) Int. Cl.
| | | |
|---|---|---|
| *H01B 1/22* | (2006.01) | |
| *C09D 5/24* | (2006.01) | |
| *C09J 9/02* | (2006.01) | |
| *C09J 161/06* | (2006.01) | |
| *H01L 23/00* | (2006.01) | |
| *H05K 1/09* | (2006.01) | |

(52) U.S. Cl.
CPC ................ *H01B 1/22* (2013.01); *C09D 5/24* (2013.01); *C09J 9/02* (2013.01); *C09J 161/06* (2013.01); *H01L 24/27* (2013.01); *H01L 24/29* (2013.01); *H01L 24/83* (2013.01); *H01L 2224/2732* (2013.01); *H01L 2224/2919* (2013.01); *H01L 2224/29147* (2013.01); *H01L 2224/83851* (2013.01); *H05K 1/095* (2013.01)

(58) Field of Classification Search
CPC .. H01B 1/00; H01B 1/22; C08L 61/00; C08L 63/00; C09D 5/24
See application file for complete search history.

(56) References Cited

U.S. PATENT DOCUMENTS

2012/0298929 A1* 11/2012 Mizumura ............... H01B 1/22
   252/513
2018/0061520 A1* 3/2018 Kajita ..................... H01B 1/22

FOREIGN PATENT DOCUMENTS

| JP | H09165606 A | 6/1997 |
|---|---|---|
| JP | H10064333 A | 3/1998 |
| JP | H10085984 A | 4/1998 |
| JP | 2008130301 A | 6/2008 |
| JP | 2009021149 A | 1/2009 |
| JP | 2009295895 A | 12/2009 |

OTHER PUBLICATIONS

International Search Report dated Oct. 11, 2016 filed in PCT/JP2016/071984.

* cited by examiner

*Primary Examiner* — Mark Kopec
(74) *Attorney, Agent, or Firm* — Rankin, Hill & Clark LLP

(57) ABSTRACT

An object of the present invention is to provide a resin composition suitable for copper pastes, which can be cured in an ambient atmosphere and has a viscosity within an appropriate range and a low specific resistance after curing. This resin composition includes (A) a copper powder, (B) a thermosetting resin, (C) a fatty acid, (D) an amine, and (E) 4-aminosalicylic acid. Preferably, the (B) component is resol-type phenolic resin. More preferably, the (C) component is at least one selected from oleic acid, linoleic acid, linolenic acid, stearic acid, palmitic acid, lauric acid, butyric acid, and propionic acid.

20 Claims, No Drawings

RESIN COMPOSITION, COPPER PASTE, AND SEMICONDUCTOR DEVICE

TECHNICAL FIELD

The present invention relates to a resin composition, a copper paste, and a semiconductor device. In particular, the present invention relates to a resin composition which can be sintered under an ambient atmosphere, a copper paste, and a semiconductor device.

BACKGROUND ART

A semiconductor device in which an electrode portion of a semiconductor element and a conductive portion of a substrate are bonded together is used in an extraordinarily wide range. For bonding the electrode portion of a semiconductor element and the conductive portion of a substrate, a conductive adhesive or soldering is generally used. The conductive adhesive has the advantage that bonding can be performed at a lower temperature than soldering, but has the drawback that the bulk resistance is higher than soldering. For this reason, studies are conducted for reducing the resistance of the conductive adhesive.

A typical conductive adhesive includes silver as a conductive filler. However, silver has migration properties and has increased in price. Therefore, use of copper as a conductive filler is under consideration. In addition, for simplifying the manufacturing process and reducing the cost and the like, it is also required that copper, which is susceptible to oxidation, of this copper-containing conductive adhesive be cured in an ambient atmosphere.

As a paste which contains copper as a conductive filler, there is disclosed a conductive copper paste which includes as essential components a copper powder having a predetermined particle size distribution and tap density, a thermosetting resin, an organic carboxylic acid, and a chelating agent, as well as polybutadiene (claim 1 and paragraphs 0013 and 0022 of PATENT LITERATURE 1).

This conductive copper paste is intended to be suitable for through holes corresponding to fine pitch by having a screen printing capability, favorable conductivity comparable to a conductive silver paste, and migration resistance properties in combination (paragraph 0008 of PATENT LITERATURE 1). It is disclosed that specific examples of the organic carboxylic acid may include salicylic acid, benzoic acid, tartaric acid, citric acid, maleic acid, succinic acid, fumaric acid, malonic acid, and the like (paragraph 0018 of PATENT LITERATURE 1). It is noted that all of these organic carboxylic acids are solid at normal temperature.

Another disclosed example is a conductive paste for circuit boards which contains a copper-containing metal powder, a compound having at least two (meth) acryl groups, and a β-dicarbonyl compound and which does not substantially contain an azo compound or a peroxide (claim 1 of PATENT LITERATURE 2). It is described that this conductive paste for circuit boards may contain a compound having flux activity (paragraph 0014 of PATENT LITERATURE 2). It is disclosed that an example of the compound having flux activity may include an aliphatic carboxylic acid such as oleic acid (paragraphs 0038 and 0046 of PATENT LITERATURE 2).

Further another disclosed example includes a conductive copper paste composition which contains a prepolymer having at least two hydroxyl groups and at least one tertiary amine in one molecule, a copper powder, an amino resin, and a reducing agent, and which can be etched with an acidic etchant (claim 1 of PATENT LITERATURE 3). It is disclosed that an example of the reducing agent may include an unsaturated monocarboxylic acid having 12 to 23 carbon atoms such as oleic acid and linoleic acid (paragraph 0016 of PATENT LITERATURE 3).

However, it has become clear that these conductive copper pastes have the problem that the specific resistance becomes high when the curing condition is high temperature and short time (for example, at 210° C. for 10 minutes).

CITATION LIST

Patent Literature

PATENT LITERATURE 1: JP-A-2008-130301
PATENT LITERATURE 2: JP-A-2009-295895
PATENT LITERATURE 3: JP-A-10-064333

SUMMARY OF THE INVENTION

Problems to be Solved by the Invention

The present inventors intensively conducted studies, and found a resin composition suitable for copper pastes by using a copper powder, a fatty acid, an amine, and 4-aminosalicylic acid in combination. This resin composition can be cured in an ambient atmosphere. This resin composition has a viscosity within an appropriate range and a low specific resistance even under the curing condition of high temperature and short time. That is, an object of the present invention is to provide a resin composition suitable for copper pastes, which can be cured in an ambient atmosphere and has a viscosity within an appropriate range and a low specific resistance after curing.

Solutions to the Problems

The present invention relates to a resin composition, a copper paste, a cured product of the copper paste, a manufacturing method of the cured product of the copper paste, and a semiconductor device, which have solved the above-described problems by having the following configurations.

<1> A resin composition containing: (A) a copper powder; (B) a thermosetting resin; (C) a fatty acid; (D) an amine; (E) 4-aminosalicylic acid; and (F) a solvent, wherein the (E) component is contained in an amount of 0.5 to 3 parts by mass with respect to 100 parts by mass in total of the (A) component and the (B) component.

<2> The resin composition according to the above-described <1>, wherein the (B) component is at least one selected from the group consisting of resol-type phenolic resin, novolac-type phenolic resin, and epoxy resin.

<3> The resin composition according to the above-described <1> or <2>, wherein the (C) component is at least one selected from the group consisting of oleic acid, linoleic acid, linolenic acid, stearic acid, palmitic acid, and lauric acid.

<4> The resin composition according to any one of the above-described <1> to <3>, wherein the (D) component contains at least one selected from the group consisting of triethanolamine, diethanolamine, and monoethanolamine.

<5> A copper paste containing the resin composition according to any one of the above-described <1> to <4>.

<6> A cured product of the copper paste according to the above-described <5>.

<7> A manufacturing method of the resin composition according to any one of the above-described <1> to <4> including mixing the (A) component, the (B) component dissolved in the (F) component, the (C) component, the (D) component, and the (E) component.

<8> A semiconductor device including a cured product of the resin composition according to any one of the above-described <1> to <4>.

Advantageous Effects of the Invention

According to the present invention <1>, there can be provided a resin composition suitable for copper pastes, which can be cured in an ambient atmosphere and has a viscosity within an appropriate range and a low specific resistance after curing.

According to the present invention <5>, there can be provided a copper paste which can be cured in an ambient atmosphere and has a viscosity within an appropriate range and a low specific resistance after curing.

According to the present invention <6>, there can be provided a cured product of a copper paste to be used for obtaining a highly reliable semiconductor device. According to the present invention <7>, there can be simply obtained a resin composition to be used for obtaining a highly reliable semiconductor device. According to the present invention <8>, there can be obtained a highly reliable semiconductor device which, for example, has a small connection resistance value between an electrode portion of a semiconductor element and a conductive portion of a substrate.

DESCRIPTION OF THE EMBODIMENTS

<Resin Composition>

A resin composition according to the present invention contains: (A) a copper powder; (B) a thermosetting resin; (C) a fatty acid; (D) an amine; (E) 4-aminosalicylic acid; and (F) a solvent. The (E) component is contained in an amount of 0.5 to 3 parts by mass with respect to 100 parts by mass in total of the (A) component and the (B) component.

The copper powder as (A) imparts conductivity to the cured resin composition. An example of the (A) component may include a copper powder having a rod-like, spherical, dendritic, flake-like, or spherical shape. From the viewpoint of the specific resistance of the cured resin composition, the (A) component is preferably a copper powder having a spherical, dendritic, or flake-like shape. Examples of a commercially available product of the (A) component may include an electrolytic copper powder manufactured by Mitsui Mining & Smelting Co., Ltd. and a reduced spherical copper powder manufactured by Namics Corporation. A commercially available product of the (A) component is preferably an electrolytic copper powder (product name: ECY, average particle size: 5 to 10 μm) manufactured by Mitsui Mining & Smelting Co., Ltd., a reduced spherical copper powder (average particle size: 6 μm) manufactured by Namics Corporation, or a flake-like powder (average particle size: 6 μm) obtained by grinding the above-described reduced spherical copper powder manufactured by Namics Corporation. Here, the average particle size is measured by a laser diffraction scattering-type particle distribution measuring device. One (A) component may be used, or two or more (A) components may be used in combination.

The thermosetting resin as the (B) component imparts adhesiveness and curing properties to the resin composition. Examples of the (B) component may include epoxy resin and phenolic resin. From the viewpoint of thermosetting shrinkage and adhesiveness, the (B) component is preferably phenolic resin, more preferably at least one selected from the group consisting of resol-type phenolic resin, novolac-type phenolic resin, and epoxy resin. Examples of a commercially available product of the (B) component may include a resol-type phenolic resin (product name: CKM-918A) manufactured by Showa Denko K.K., a novolac-type phenol (product name: Resitop PSM-4324) manufactured by Gun Ei Chemical Industry Co., Ltd., an epoxy resin (product name: EPPN-501HY) manufactured by Nippon Kayaku Co., Ltd., and an epoxy resin (product name: JER 1031S) manufactured by Mitsubishi Chemical Corporation. One (B) component may be used, or two or more (B) components may be used in combination. It is noted that when preparing a paste, solid resin like resol-type phenolic resin may be mixed while heating with the later-described solvent as the (E) component to obtain and use a liquid mixture.

The fatty acid as the (C) component functions as a flux component which elutes an oxidized layer on the surface of the copper powder. The (C) component is preferably at least one selected from oleic acid, linoleic acid, linolenic acid, stearic acid, palmitic acid, lauric acid, butyric acid, and propionic acid. When the (C) component is liquid during the preparation of the resin composition, uniformity in the resin composition and wettability onto the surface of the copper powder as the (A) component are favorable. Therefore, it is considered that the (C) component being liquid during the preparation of the resin composition is preferable. Examples of the (C) component may include oleic acid ($CH_3(CH_2)_7CH=CH(CH_2)_7COOH$, cis-9-octadecenoic acid), linoleic acid ($CH_3—(CH_2)_4—CH=CHCH_2CH=CH(CH_2)_7COOH$, cis-9,cis-12-octadecadienoic acid), linolenic acid ($CH_3CH_2CH=CHCH_2CH=CHCH_2CH=CH(CH_2)_7COOH$, cis-9,cis-12, cis-15-octadecatrienoic acid), stearic acid ($CH_3(CH_2)_{16}COOH$, octadecanoic acid), palmitic acid ($CH_3(CH_2)_{14}COOH$, hexadecanoic acid), and lauric acid ($CH_3(CH_2)_{10}COOH$, dodecanoic acid). The (C) component is more preferably oleic acid. Here, oleic acid, linoleic acid, and linolenic acid are liquid at normal temperature (25° C.). Stearic acid, palmitic acid, and lauric acid are solid at normal temperature. The (C) component can be used in both liquid and solid states. One (C) component may be used, or two or more (C) components may be used in combination.

The amine as the (D) component immobilizes copper ions eluted due to the flux effect by the (C) component and inhibits the action of the carboxyl group contained in the fatty acid at room temperature (25° C.). Examples of the (D) component may include triethanolamine (TEA, $N(CH_2CH_2OH)_3$), diethanolamine (DEA, $NH(CH_2CH_2OH)_2$), and monoethanolamine (MEA, $NH_2(CH_2CH_2OH)$). The (D) component preferably contains at least one selected from the group consisting of triethanolamine, diethanolamine, and monoethanolamine.

The 4-aminosalicylic acid (4-amino-2-hydroxybenzoate) as the (E) component is represented by chemical formula (1):

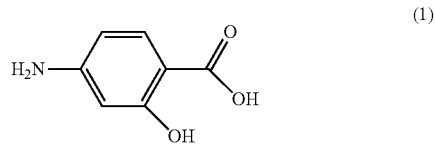 [SMILES: Nc1ccc(C(=O)O)c(O)c1]

(1)

The 4-aminosalicylic acid as the (E) component inhibits oxidation of the (A) component. Since the phenol portion of the (E) component has a free radical absorbing capability, the (E) component absorbs active oxygen on the surface of the (A) component. Furthermore, the hydroxy group portion of the (E) component has reduction action. Therefore, the (E) component is considered to have two actions of oxidation inhibition and reduction. In addition, the (E) component promotes a decrease in the resistance of the cured resin composition by an interaction with the (C) component and an interaction with the (D) component.

The resin composition further includes the solvent as the (F) component, from the viewpoint of melting or liquefaction of the (B) component when the (B) component is solid, and preparation of the viscosity of the resin composition. The (F) component can be appropriately selected in consideration of the solubility and curing condition of the thermosetting resin. Specific examples of the (F) component may include ethyl carbitol, ethyl carbitol acetate, butyl carbitol, butyl carbitol acetate, terpineol, dihydroterpineol, ethyl cellosolve, butyl cellosolve, ethyl cellosolve acetate, butyl cellosolve acetate, glycol ether, diethylene glycol, ethylene glycol monophenyl ether, and the like. When the (B) component is phenolic resin, butyl carbitol is preferably used.

The amount of the (A) component, with respect to 100 parts by mass in total of the (A) component and the (B) component, is preferably 80 to 98 parts by mass, more preferably 85 to 96 parts by mass, further preferably 88 to 95 parts by mass, from the viewpoint of the curing properties of the resin composition and the specific resistance of the cured resin composition.

The amount of the (B) component, with respect to 100 parts by mass in total of the (A) component and the (B) component, is preferably 2 to 20 parts by mass, from the viewpoint of the curing properties of the resin composition and the specific resistance of the cured resin composition.

Also, even in the cured product of the resin composition, the amount of the (B) component, with respect to 100 parts by mass in total of the (A) component and the (B) component, is preferably 2 to 20 parts by mass. Here, the quantitative analysis of the (B) component is performed by an ion chromatograph-mass spectrometer.

The amount of the (C) component, with respect to 100 parts by mass in total of the (A) component and the (B) component, is preferably 0.5 to 5 parts by mass, more preferably 1 to 3 parts by mass, particularly preferably 1 part by mass. When the amount of (C) component is less than 1 part by mass, the cured resin composition is likely to have an increased specific resistance value. When the amount of (C) component is more than 3 parts by mass, the resin composition is likely to have shorter pot life.

Also, even in the cured product of the resin composition, the amount of the (C) component, with respect to 100 parts by mass in total of the (A) component and the (B) component, is preferably 0.5 to 5 parts by mass, more preferably 1 to 3 parts by mass, particularly preferably 1 part by mass. Here, the quantitative analysis of the (C) component is performed by an ion chromatograph-mass spectrometer.

The amount of the (D) component, with respect to 100 parts by mass in total of the (A) component and the (B) component, is preferably 1 to 10 parts by mass, more preferably 1 to 5 parts by mass. When the amount of (D) component is less than 1 part by mass, the resin composition is likely to have shorter pot life. When the amount of (D) component is more than 10 parts by mass, the cured resin composition is likely to have an increased specific resistance value.

Also, even in the cured product of the resin composition, the amount of the (D) component, with respect to 100 parts by mass in total of the (A) component and the (B) component, is preferably 1 to 10 parts by mass, more preferably 1 to 5 parts by mass. Here, the quantitative analysis of the (D) component is performed with an ion chromatograph-mass spectrometer.

The amount of the (E) component, with respect to 100 parts by mass of the resin composition, is 0.5 to 3 parts by mass, preferably 1 part by mass. When the amount of (C) component is less than 1 part by mass, the cured resin composition is likely to have an increased specific resistance value. When the amount of (C) component is more than 3 parts by mass, the resin composition is likely to have shorter pot life.

Also, even in the cured product of the resin composition, the amount of the (E) component, with respect to 100 parts by mass in total of the (A) component and the (B) component, is preferably 0.5 to 3 parts by mass. Here, the quantitative analysis of the (E) component is performed with an ion chromatograph-mass spectrometer.

The amount of the (F) component, with respect to 100 parts by mass of the resin composition, is preferably 8 to 22 parts by mass, more preferably 10 to 20 parts by mass.

The resin composition according to the present invention can further include, as necessary, an additive and the like, such as a leveling agent, a coloring agent, an ion trapping agent, an antifoaming agent, a flame retardant, a rust inhibitor, and a surfactant, as long as the object of the present invention is not impaired.

The resin composition according to the present invention can be obtained by, for example, simultaneously or separately stirring, melting, mixing and dispersing the (A) to (F) components, other additives, and the like, while performing a heat treatment as necessary. Here, from the viewpoint of the uniformity of the resin composition, the (B) component is preferably dissolved in the (F) component. An apparatus which can be used for these mixing, stirring, dispersion, and the like is not particularly limited. Examples of such an apparatus to be used may include a kneader equipped with a stirrer and a heater, a triple roll mill, a ball mill, a planetary mixer, a bead mill, or the like. Also, these apparatuses may be appropriately used in combination.

The initial viscosity of the resin composition is preferably in the range of 10 to 500 Pa·s from the viewpoint of screen printing properties. Here, the initial viscosity of the resin composition is measured at 10 rotations at 25° C. by a Brookfield-type (B-type) viscometer within one hour after the resin composition was prepared.

<Copper Paste>

As the copper paste according to the present invention, the above-described resin composition is used. This copper paste is formed or applied onto a desired position of an electronic component such as a conductive portion of a substrate and an electrode portion of a semiconductor element by screen printing or a dispenser, or the like.

The cured product of the copper paste according to the present invention has low resistance, and migration resistance superior to that of a cured product of a typical silver paste. Therefore, a highly reliable semiconductor can be provided.

The curing condition of the copper paste according to the present invention is preferably at 150 to 300° C. for 5 to 60 minutes, particularly suitably at 200 to 220° C. for 5 to 30 minutes, under an ambient atmosphere. The cured product of the copper paste has low specific resistance. Here, the cured product of the copper paste according to the present invention can be manufactured by printing the copper paste on a substrate by screen printing and thereafter heating the printed paste at 200 to 220° C. for 5 to 60 minutes under an ambient atmosphere.

The copper paste according to the present invention is suitable as an adhesive for electronic components such as an electrode portion of a semiconductor element and a conductive portion of a substrate.

<Semiconductor Device>

The semiconductor device according to the present invention includes the above-described cured product of the resin composition. The semiconductor device also includes, for example, a substrate having a conductive portion and a semiconductor element having an electrode portion. The conductive portion of a substrate and the electrode portion of a semiconductor element are bonded together with the cured product of the copper paste which contains the above-described resin composition.

The semiconductor device according to the present invention has a small connection resistance value between the electrode portion of a semiconductor element and the conductive portion of a substrate, and also has excellent migration resistance. Therefore, high reliability can be obtained.

EXAMPLES

The present invention will be described by way of examples. However, the present invention is not limited to these examples. It is noted that in the following examples, "parts" and "%" indicate parts by mass and % by mass respectively, unless otherwise stated.

<Evaluation Method>

«Measurement of Viscosity»

The initial viscosity of the resin composition was measured at one rotation and 10 rotations at 25° C. by a Brookfield-type (B-type) viscometer within one hour after the resin composition was prepared. The viscosity at one rotation is suitably in the range of 20 to 700 Pa·s, more suitably in the range of 20 to 60 Pa·s. The viscosity at 10 rotations is suitably in the range of 10 to 500 Pa·s, more suitably in the range of 10 to 15 Pa·s. Also, the thixotropy ratio was calculated according to [(viscosity at one rotation)/(viscosity at 10 rotations)]. The thixotropy ratio is suitably in the range of 1.0 to 5.0.

«Specific Resistance»

A pattern having a width of 1 mm and a length of 71 mm was printed with the resin composition on an alumina substrate by a screen printer. This resin composition was cured by a heat treatment at 200° C. for 30 minutes under an ambient atmosphere or a nitrogen atmosphere with a blast constant-temperature dryer. The film thickness of the obtained cured product of the resin composition was measured by a surface texture and shape measuring instrument (Model No.: Surfcom 1500SD-2) manufactured by Tokyo Seimitsu Co., Ltd. The resistance value of the obtained cured product of the resin composition was measured by a digital multimeter (Model No.: 2001) manufactured by TFF Keithley Instruments, Inc. The calculated volume resistivity was defined as the specific resistance.

«Measurement of Shear Strength»

A 1.5 mm □5×5-block pattern was printed on a 20 mm □alumina substrate through a 250-mesh stainless screen with each resin composition. On ten locations on this alumina substrate, 3216-size alumina chips were placed. This alumina substrate was subjected to a heat treatment at 200° C. for 30 minutes, whereby this resin composition was cured. After the resin was cured, the shear strength at a weighting rate of 12 mm/min was measured by a desktop strength tester (Model No.: 1605HTP) manufactured by Aikoh Engineering Co., Ltd.

Example 1

With a triple roll mill, 93.0 parts by mass of an electrolytic copper powder as the (A) component, 7.0 parts of resol-type phenolic resin as the (B) component dissolved with heat in 17.5 parts of butyl carbitol as the (F) component, 1.0 part of oleic acid as the (C) component, 3.0 parts of triethanolamine as the (D) component, and 2.0 parts of 4-aminosalicylic acid as the (E) component were uniformly kneaded. Thus, a resin composition was prepared. A cured product of this resin composition was measured for its specific resistance. The result is indicated in Table 1.

Examples 2 to 23 and Comparative Examples 1 TO 10

As indicated in Tables 1 to 4, resin compositions were prepared by the same method as Example 1 except for the formulation, and the prepared resin compositions were evaluated for their viscosity and specific resistance. The result is indicated in Tables 1 to 4.

TABLE 1

| | | | Example 1 | Example 2 | Example 3 | Example 4 | Example 5 | Comparative Example 1 |
|---|---|---|---|---|---|---|---|---|
| (A) Component | Electrolytic copper powder[1] | | 93.0 | 93.0 | 93.0 | 93.0 | 93.0 | 93.0 |
| | Liquid phase reduced spherical copper powder[2] | | 0 | 0 | 0 | 0 | 0 | 0 |
| | Pot mill processed flake copper powder[3] | | 0 | 0 | 0 | 0 | 0 | 0 |
| (B) Component | Phenol[4] | | 7.0 | 7.0 | 7.0 | 7.0 | 7.0 | 7.0 |
| (C) Component | Oleic acid[5] | | 1.0 | 1.0 | 0 | 1.0 | 0 | 1.0 |
| | Stearic acid[6] | | 0 | 0 | 1.0 | 0 | 0 | 0 |
| | Palmitin[7] | | 0 | 0 | 0 | 1.0 | 0 | 0 |
| | Lauric acid[8] | | 0 | 0 | 0 | 0 | 1.0 | 0 |
| (D) Component | TEA[9] | | 3.0 | 3.0 | 3.0 | 3.0 | 3.0 | 3.0 |
| | DEA[10] | | 0 | 0 | 0 | 0 | 0 | 0 |
| | MEA[11] | | 0 | 0 | 0 | 0 | 0 | 0 |
| (E) Component | PAS[12] | | 2.0 | 2.0 | 2.0 | 2.0 | 2.0 | 0.25 |
| (E') Component | MAS[13] | | 0 | 0 | 0 | 0 | 0 | 0 |
| (F) Component | Butyl carbitol[14] | | 17.5 | 8.5 | 18.0 | 16.0 | 17.5 | 15.5 |
| Evaluation result | Viscosity (Unit: Pa · s) | 1 rpm | 30 | 680 | 20 | 30 | 20 | 20 |
| | viscosity | 10 rpm | 14 | 453 | 12 | 14 | 10 | 12 |

TABLE 1-continued

|  |  |  |  |  |  |  |  |
|---|---|---|---|---|---|---|---|
| Thixotropy ratio | (1 rpm/10 rpm) | 2.14 | 1.50 | 1.67 | 2.14 | 2.00 | 1.67 |
| Specific resistance (Unit: μΩ·cm) | Sintered under ambient atmosphere | 63.9 | 49.6 | 58.4 | 51.0 | 66.6 | 315.5 |
|  | Sintered under nitrogen atmosphere | 28.8 | 23.1 | 27.4 | 22.2 | 61.3 | 34.2 |
| Shear strength (Unit: kN/cm²) | Sintered under ambient atmosphere | 2.46 | 1.72 | 2.10 | 2.11 | 2.53 | 2.47 |
|  | Sintered under nitrogen atmosphere | 1.32 | 0.98 | 1.14 | 1.41 | 1.52 | 1.45 |

|  |  |  | Example 6 | Example 7 | Example 8 | Comparative Example 2 |
|---|---|---|---|---|---|---|
| (A) Component | Electrolytic copper powder[1] |  | 93.0 | 93.0 | 93.0 | 93.0 |
|  | Liquid phase reduced spherical copper powder[2] |  | 0 | 0 | 0 | 0 |
|  | Pot mill processed flake copper powder[3] |  | 0 | 0 | 0 | 0 |
| (B) Component | Phenol[4] |  | 7.0 | 7.0 | 7.0 | 7.0 |
| (C) Component | Oleic acid[5] |  | 1.0 | 1.0 | 1.0 | 1.0 |
|  | Stearic acid[6] |  | 0 | 0 | 0 | 0 |
|  | Palmitin[7] |  | 0 | 0 | 0 | 0 |
|  | Lauric acid[8] |  | 0 | 0 | 0 | 0 |
| (D) Component | TEA[9] |  | 3.0 | 3.0 | 3.0 | 3.0 |
|  | DEA[10] |  | 0 | 0 | 0 | 0 |
|  | MEA[11] |  | 0 | 0 | 0 | 0 |
| (E) Component | PAS[12] |  | 0.5 | 1.0 | 3.0 | 4.0 |
| (E') Component | MAS[13] |  | 0 | 0 | 0 | 0 |
| (F) Component | Butyl carbitol[14] |  | 15.0 | 15.5 | 18.0 | 18.0 |
| Evaluation result | Viscosity (Unit: Pa·s) | 1 rpm | 20 | 30 | 30 | 30 |
|  |  | 10 rpm | 15 | 12 | 12 | 14 |
|  | Thixotropy ratio | (1 rpm/10 rpm) | 1.33 | 2.50 | 2.50 | 2.14 |
|  | Specific resistance (Unit: μΩ·cm) | Sintered under ambient atmosphere | 91.6 | 58.4 | 66.6 | 2157.8 |
|  |  | Sintered under nitrogen atmosphere | 40.2 | 43.8 | 35.9 | 36.1 |
|  | Shear strength (Unit: kN/cm²) | Sintered under ambient atmosphere | 2.30 | 2.40 | 2.34 | 2.15 |
|  |  | Sintered under nitrogen atmosphere | 1.56 | 1.14 | 1.23 | (Not measured) |

[1] Electrolytic copper powder (product name: ECY-4, average particle size: 7 μm) manufactured by Mitsui Mining & Smelting Co., Ltd.
[2] Liquid phase reduced spherical copper powder (prepared by method described in JP-A-9-165606, average particle size: 6 μm) manufactured by Namics Corporation
[3] Flake-like powder (average particle size: 6 μm) obtained by grinding the above-described liquid phase reduced spherical copper powder manufactured by Namics Corporation with ball mill
[4] Resol-type phenol (product name: Shonol CKM918A) manufactured by Showa Denko K.K.
[5] Oleic acid manufactured by Wako Pure Chemical industries, Ltd.
[6] Stearic acid manufactured by Wako Pure Chemical Industries, Ltd.
[7] Palmitic acid manufactured by Wako Pure Chemical Industries, Ltd.
[8] Lauric acid manufactured by Wako Pure Chemical Industries, Ltd.
[9] Triethanolamine manufactured by Wako Pure Chemical Industries, Ltd.
[10] Diethanolamine manufactured by Wako Pure Chemical Industries, Ltd.
[11] Monoethanolamine manufactured by Wako Pure Chemical Industries, Ltd.
[12] 4-Aminosalicylic acid manufactured by Wako Pure Chemical Industries, Ltd.
[13] 5-Aminosalicylic acid manufactured by Wako Pure Chemical Industries, Ltd.
[14] Butyl carbitol manufactured by Shell Chemical Japan Ltd.

TABLE 2

|  |  | Example 9 | Example 10 | Comparative Example 3 | Comparative Example 4 | Comparative Example 5 |
|---|---|---|---|---|---|---|
| (A) Component | Electrolytic copper powder[1] | 0 | 0 | 93.0 | 93.0 | 93.0 |
|  | Liquid phase reduced spherical copper powder[2] | 93.0 | 0 | 0 | 0 | 0 |
|  | Pot mill processed flake copper powder[3] | 0 | 93.0 | 0 | 0 | 0 |
| (B) Component | Phenol[4] | 7.0 | 7.0 | 7.0 | 7.0 | 7.0 |
| (C) Component | Oleic acid[5] | 1.0 | 1.0 | 0 | 1.0 | 0 |
|  | Stearic acid[6] | 0 | 0 | 0 | 0 | 0 |
|  | Palmitin[7] | 0 | 0 | 0 | 0 | 0 |
|  | Lauric acid[8] | 0 | 0 | 0 | 0 | 0 |
| (D) Component | TEA[9] | 3.0 | 3.0 | 0 | 3.0 | 0 |
|  | DEA[10] | 0 | 0 | 0 | 0 | 0 |
|  | MEA[11] | 0 | 0 | 0 | 0 | 0 |

TABLE 2-continued

|  |  |  |  |  |  |  |
|---|---|---|---|---|---|---|
| (E) Component | PAS[12] |  | 2.0 | 2.0 | 0 | 0 | 2.0 |
| (E') Component | MAS[13] |  | 0 | 0 | 0 | 0 | 0 |
| (F) Component | Butyl carbitol[14] |  | 20.5 | 17.0 | 15.5 | 15.5 | 17.5 |
| Evaluation result | Viscosity viscosity (Unit: Pa·s) | 1 rpm | 60 | 60 | 60 | 30 | 20 |
|  |  | 10 rpm | 14 | 13 | 14 | 11 | 11 |
|  | Thixotropy ratio (1 rpm/10 rpm) |  | 4.29 | 4.62 | 4.29 | 2.73 | 1.82 |
|  | Specific resistance (Unit: μΩ·cm) | Sintered under ambient atmosphere | 52.3 | 29.4 | Measurement disabled | 411.0 | Measurement disabled |
|  |  | Sintered under nitrogen atmosphere | 23.6 | 18.6 | 52792.2 | 51.5 | Measurement disabled |
|  | Shear strength (Unit: kN/cm²) | Sintered under ambient atmosphere | 1.16 | 1.57 | 1.88 | 2.77 | 2.04 |
|  |  | Sintered under nitrogen atmosphere | 0.73 | 0.96 | 1.40 | 2.03 | 0.87 |

|  |  |  | Comparative Example 6 | Comparative Example 7 | Comparative Example 8 | Comparative Example 9 | Comparative Example 10 |
|---|---|---|---|---|---|---|---|
| (A) Component | Electrolytic copper powder[1] |  | 93.0 | 93.0 | 93.0 | 93.0 | 93.0 |
|  | Liquid phase reduced spherical copper powder[2] |  | 0 | 0 | 0 | 0 | 0 |
|  | Pot mill processed flake copper powder[3] |  | 0 | 0 | 0 | 0 | 0 |
| (B) Component | Phenol[4] |  | 7.0 | 7.0 | 7.0 | 7.0 | 7.0 |
| (C) Component | Oleic acid[5] |  | 1.0 | 0 | 1.0 | 0 | 1.0 |
|  | Stearic acid[6] |  | 0 | 0 | 0 | 0 | 0 |
|  | Palmitin[7] |  | 0 | 0 | 0 | 0 | 0 |
|  | Lauric acid[8] |  | 0 | 0 | 0 | 0 | 0 |
| (D) Component | TEA[9] |  | 0 | 3.0 | 0 | 3.0 | 3.0 |
|  | DEA[10] |  | 0 | 0 | 0 | 0 | 0 |
|  | MEA[11] |  | 0 | 0 | 0 | 0 | 0 |
| (E) Component | PAS[12] |  | 0 | 0 | 2.0 | 2.0 | 0 |
| (E') Component | MAS[13] |  | 0 | 0 | 0 | 0 | 2.0 |
| (F) Component | Butyl carbitol[14] |  | 23.0 | 15.5 | 15.5 | 18.5 | 23.0 |
| Evaluation result | Viscosity viscosity (Unit: Pa·s) | 1 rpm | 90 | 30 | 30 | 30 | 20 |
|  |  | 10 rpm | 14 | 15 | 15 | 15 | 12 |
|  | Thixotropy ratio (1 rpm/10 rpm) |  | 6.43 | 2.00 | 2.00 | 2.00 | 1.67 |
|  | Specific resistance (Unit: μΩ·cm) | Sintered under ambient atmosphere | Measurement disabled | Measurement disabled | Measurement disabled | 2443.5 | 317.9 |
|  |  | Sintered under nitrogen atmosphere | 236.1 | 389.1 | Measurement disabled | 738.0 | 1115.2 |
|  | Shear strength (Unit: kN/cm²) | Sintered under ambient atmosphere | 1.45 | 2.93 | 2.25 | 2.32 | 2.47 |
|  |  | Sintered under nitrogen atmosphere | 1.59 | 1.67 | 1.44 | 0.94 | 2.04 |

TABLE 3

|  |  | Example 11 | Example 12 | Example 13 | Example 14 | Example 15 |
|---|---|---|---|---|---|---|
| (A) Component | Electrolytic copper powder[1] | 93.0 | 93.0 | 930 | 93.0 | 93.0 |
|  | Liquid phase reduced spherical copper powder[2] | 0 | 0 | 0 | 0 | 0 |
|  | Pot mill processed flake copper powder[3] | 0 | 0 | 0 | 0 | 0 |
| (B) Component | Phenol[4] | 0 | 0 | 7.0 | 7.0 | 7.0 |
|  | Phenol[15] | 3.0 | 2.5 | 0 | 0 | 0 |
|  | Epoxy resin[16] | 4.0 | 0 | 0 | 0 | 0 |
|  | Epoxy resin[17] | 0 | 4.5 | 0 | 0 | 0 |
| (C) Component | Oleic acid[5] | 1.0 | 1.0 | 1.0 | 1.0 | 1.0 |
|  | Stearic acid[6] | 0 | 0 | 0 | 0 | 0 |
|  | Palmitin[7] | 0 | 0 | 0 | 0 | 0 |
|  | Lauric acid[8] | 0 | 0 | 0 | 0 | 0 |
| (D) Component | TEA[9] | 3.0 | 3.0 | 3.0 | 3.0 | 3.0 |
|  | DEA[10] | 0 | 0 | 0 | 0 | 0 |
|  | MEA[11] | 0 | 0 | 0 | 0 | 0 |
| (E) Component | PAS[12] | 2.0 | 2.0 | 2.0 | 2.0 | 2.0 |
| (E') Component | MAS[13] | 0 | 0 | 0 | 0 | 0 |
| (F) Component | Butyl carbitol[14] | 20.5 | 17.0 | 0 | 0 | 0 |
|  | Butyl carbitol acetate[18] | 0 | 0 | 12.5 | 0 | 0 |

TABLE 3-continued

|  |  |  |  |  |  |  |  |
|---|---|---|---|---|---|---|---|
|  | Ethylene glycol monophenyl ether[19] |  | 0 | 0 | 0 | 20.5 | 0 |
|  | Diethylene glycol[20] |  | 0 | 0 | 0 | 0 | 9.5 |
| Evaluation result | Viscosity viscosity (Unit: Pa·s) | 1 rpm | 20 | 20 | 20 | 40 | 30 |
|  |  | 10 rpm | 11 | 13 | 15 | 12 | 13 |
|  | Thixotropy ratio (1 rpm/10 rpm) |  | 1.82 | 1.54 | 1.33 | 3.33 | 2.31 |
|  | Specific resistance (Unit: μΩ·cm) | Sintered under ambient atmosphere | 51.3 | 46.9 | 72.2 | 66.3 | 52.5 |
|  |  | Sintered under nitrogen atmosphere | 56.6 | 51.2 | 28.9 | 38.9 | 17.8 |
|  | Shear strength (Unit: kN/cm²) | Sintered under ambient atmosphere | 2.41 | 2.25 | 2.72 | 2.77 | 1.49 |
|  |  | Sintered under nitrogen atmosphere | 2.64 | 2.42 | 1.81 | 1.27 | 0.73 |

|  |  |  | Example 16 | Example 17 | Example 18 | Example 19 |
|---|---|---|---|---|---|---|
| (A) Component | Electrolytic copper powder[1] |  | 90.0 | 96.0 | 93.0 | 93.0 |
|  | Liquid phase reduced spherical copper powder[2] |  | 0 | 0 | 0 | 0 |
|  | Pot mill processed flake copper powder[3] |  | 0 | 0 | 0 | 0 |
| (B) Component | Phenol[4] |  | 10.0 | 4.0 | 7.0 | 7.0 |
|  | Phenol[15] |  | 0 | 0 | 0 | 0 |
|  | Epoxy resin[16] |  | 0 | 0 | 0 | 0 |
|  | Epoxy resin[17] |  | 0 | 0 | 0 | 0 |
| (C) Component | Oleic acid[5] |  | 1.0 | 1.0 | 0.5 | 5.0 |
|  | Stearic acid[6] |  | 0 | 0 | 0 | 0 |
|  | Palmitin[7] |  | 0 | 0 | 0 | 0 |
|  | Lauric acid[8] |  | 0 | 0 | 0 | 0 |
| (D) Component | TEA[9] |  | 3.0 | 3.0 | 3.0 | 3.0 |
|  | DEA[10] |  | 0 | 0 | 0 | 0 |
|  | MEA[11] |  | 0 | 0 | 0 | 0 |
| (E) Component | PAS[12] |  | 2.0 | 2.0 | 2.0 | 2.0 |
| (E') Component | MAS[13] |  | 0 | 0 | 0 | 0 |
| (F) Component | Butyl carbitol[14] |  | 15.5 | 13.0 | 17.0 | 10.0 |
|  | Butyl carbitol acetate[18] |  | 0 | 0 | 0 | 0 |
|  | Ethylene glycol monophenyl ether[19] |  | 0 | 0 | 0 | 0 |
|  | Diethylene glycol[20] |  | 0 | 0 | 0 | 0 |
| Evaluation result | Viscosity viscosity (Unit: Pa·s) | 1 rpm | 20 | 30 | 20 | 20 |
|  |  | 10 rpm | 15 | 12 | 10 | 14 |
|  | Thixotropy ratio (1 rpm/10 rpm) |  | 1.33 | 2.50 | 2.00 | 1.43 |
|  | Specific resistance (Unit: μΩ·cm) | Sintered under ambient atmosphere | 76.5 | 191.2 | 75.2 | 203.2 |
|  |  | Sintered under nitrogen atmosphere | 54.1 | 35.9 | 41.8 | 57.6 |
|  | Shear strength (Unit: kN/cm²) | Sintered under ambient atmosphere | 3.17 | 2.33 | 2.78 | 1.27 |
|  |  | Sintered under nitrogen atmosphere | 2.37 | 0.49 | 1.55 | 0.43 |

[15] Novolac-type phenol (product name: Resitop PSM4324) manufactured by Gun Ei Chemical Industry Co., Ltd.
[16] Epoxy resin (product name: EPPN-501HY) manufactured by Nippon Kayaku Co., Ltd.
[17] Epoxy resin (product name: JER 1031S) manufactured by Mitsubishi Chemical Corporation
[18] Butyl carbitol acetate (product name: BCA) manufactured by Yoneyama Yakuhin Kogyo Co., Ltd.
[19] Ethylene glycol monophenyl ether (product name: Hisolve EPH) manufactured by Toho Chemical Industry Co., Ltd.
[20] Diethylene glycol (product name: DEG) manufactured by Wako Pure Chemical Industries, Ltd.

TABLE 4

|  |  | Example 20 | Example 21 | Example 22 | Example 23 |
|---|---|---|---|---|---|
| (A) Component | Electrolytic copper powder[1] | 93.0 | 93.0 | 93.0 | 93.0 |
|  | Liquid phase reduced spherical copper powder[2] | 0 | 0 | 0 | 0 |
|  | Pot mill processed flake copper powder[3] | 0 | 0 | 0 | 0 |
| (B) Component | Phenol[4] | 7.0 | 7.0 | 7.0 | 7.0 |
|  | Phenol[15] | 0 | 0 | 0 | 0 |
|  | Epoxy resin[16] | 0 | 0 | 0 | 0 |
|  | Epoxy resin[17] | 0 | 0 | 0 | 0 |
| (C) Component | Oleic acid[5] | 1.0 | 1.0 | 1.0 | 1.0 |
|  | Stearic acid[6] | 0 | 0 | 0 | 0 |
|  | Palmitin[7] | 0 | 0 | 0 | 0 |
|  | Lauric acid[8] | 0 | 0 | 0 | 0 |

TABLE 4-continued

|  |  |  | Example 20 | Example 21 | Example 22 | Example 23 |
|---|---|---|---|---|---|---|
| (D) Component | TEA[9)] |  | 1.0 | 10.0 | 0 | 0 |
|  | DEA[10)] |  | 0 | 0 | 3.0 | 0 |
|  | MEA[11)] |  | 0 | 0 | 0 | 3.0 |
| (E) Component | PAS[12)] |  | 2.0 | 2.0 | 2.0 | 2.0 |
| (E') Component | MAS[13)] |  | 0 | 0 | 0 | 0 |
| (F) Component | Butyl carbitol[14)] |  | 16.0 | 12.0 | 18.0 | 16.5 |
|  | Butyl carbitol acetate[18)] |  | 0 | 0 | 0 | 0 |
|  | Hisolve EPH[19)] |  | 0 | 0 | 0 | 0 |
|  | Diethylene glycol[20)] |  | 0 | 0 | 0 | 0 |
| Evaluation result | Viscosity viscosity (Unit: Pa · s) | 1 rpm | 40 | 20 | 10 | 20 |
|  |  | 10 rpm | 14 | 11 | 10 | 14 |
|  | Thixotropy ratio | (1 rpm/10 rpm) | 2.86 | 1.82 | 1.00 | 1.43 |
|  | Specific resistance (Unit: μΩ · cm) | Sintered under ambient atmosphere | 93.6 | 86.2 | 148.1 | 50.1 |
|  |  | Sintered under nitrogen atmosphere | 28.3 | 41.9 | 57.4 | 24.0 |
|  | Shear strength (Unit: kN/cm$^2$) | Sintered under ambient atmosphere | 3.02 | 2.22 | 1.08 | 2.32 |
|  |  | Sintered under nitrogen atmosphere | 1.41 | 1.14 | 1.01 | 1.18 |

As understood from Table 1 and Table 2, in all of Examples 1 to 23, the specific resistance when cured in a nitrogen atmosphere was less than $7.0 \times 10^{-5}$ Ω·cm, the specific resistance when cured in an ambient atmosphere was less than $2.1 \times 10^{-4}$ Ω·cm, the viscosity and thixotropy ratio were within an appropriate range, and the shear strength was high. In particular, the specific resistance when the copper paste of each of Examples 1 to 4, 6 to 10, and 13 to 15 was cured in a nitrogen atmosphere was less than $5.0 \times 10^{-5}$ Ω·cm, which was at the same level as that of a cured body of a silver paste. In particular, in Examples 2 and 10, the specific resistance when cured in an ambient atmosphere was also less than $5.0 \times 10^{-5}$ Ω·cm, which was at the same level as that of a cured body of a silver paste. On the contrary, in each of Comparative Example 1 including an excessively small amount of the (E) component and Comparative Example 2 including an excessively large amount of the (E) component, the specific resistance value when cured in an ambient atmosphere was high. In each of Comparative Example 3 not including the (C) component, the (D) component, or the (E) component, Comparative Example 5 not including the (C) component or the (D) component, Comparative Example 7 not including the (C) component or the (E) component, Comparative Example 8 not including the (D) component, Comparative Example 9 not including the (C) component, and Comparative Example 10 including mesalazine instead of the (E) component, both the specific resistance value when cured in a nitrogen atmosphere and the specific resistance value when cured in an ambient atmosphere were extraordinarily high. In each of Comparative Example 4 not including the (E) component and Comparative Example 6 not including the (D) component or the (E) component, the specific resistance value when cured in an ambient atmosphere was extraordinarily high.

INDUSTRIAL APPLICABILITY

The resin composition according to the present invention can be cured in an ambient atmosphere, and also has a viscosity within an appropriate range and a low specific resistance value after the resin composition is cured. Therefore, the resin composition according to the present invention is extraordinarily useful.

The invention claimed is:

1. A resin composition comprising:
   (A) a copper powder;
   (B) a thermosetting resin;
   (C) a fatty acid;
   (D) an amine;
   (E) 4-aminosalicylic acid; and
   (F) a solvent, wherein
   the (E) component is contained in an amount of 0.5 to 3 parts by mass with respect to 100 parts by mass in total of the (A) component and the (B) component.

2. The resin composition according to claim 1, wherein the (B) component is at least one selected from the group consisting of resol-type phenolic resin, novolac-type phenolic resin, and epoxy resin.

3. The resin composition according to claim 2, wherein the (C) component is at least one selected from the group consisting of oleic acid, linoleic acid, linolenic acid, stearic acid, palmitic acid, and lauric acid.

4. The resin composition according to claim 2, wherein the (D) component contains at least one selected from the group consisting of triethanolamine, diethanolamine, and monoethanolamine.

5. A copper paste comprising the resin composition according to claim 2.

6. A manufacturing method of the resin composition according to claim 2, comprising mixing the (A) component, the (B) component dissolved in the (F) comprising, the (C) component, the (D) component, and the (E) component.

7. A semiconductor device comprising a cured product of the resin composition according to claim 2.

8. The resin composition according to claim 1, wherein the (C) component is at least one selected from the group consisting of oleic acid, linoleic acid, linolenic acid, stearic acid, palmitic acid, and lauric acid.

9. The resin composition according to claim 8, wherein the (D) component contains at least one selected from the group consisting of triethanolamine, diethanolamine, and monoethanolamine.

10. A copper paste comprising the resin composition according to claim 8.

11. A manufacturing method of the resin composition according to claim 8, comprising mixing the (A) component, the (B) component dissolved in the (F) component, the (C) component, the (D) component, and the (E) component.

12. A semiconductor device comprising a cured product of the resin composition according to claim 8.

13. The resin composition according to claim 1, wherein the (D) component contains at least one selected from the group consisting of triethanolamine, diethanolamine, and monoethanolamine.

14. A copper paste comprising the resin composition according to claim 13.

15. A manufacturing method of the resin composition according to claim 13, comprising mixing the (A) component, the (B) component dissolved in the (F) component, the (C) component, the (D) component, and the (E) component.

16. A semiconductor device comprising a cured product of the resin composition according to claim 13.

17. A copper paste comprising the resin composition according to claim 1.

18. A cured product of the copper paste according to claim 17.

19. A manufacturing method of the resin composition according to claim 1, comprising mixing the (A) component, the (B) component dissolved in the (F) component, the (C) component, the (D) component, and the (E) component.

20. A semiconductor device comprising a cured product of the resin composition according to claim 1.

* * * * *